United States Patent [19]
Yokoyama et al.

[11] Patent Number: 5,276,340
[45] Date of Patent: Jan. 4, 1994

[54] SEMICONDUCTOR INTEGRATED CIRCUIT HAVING A REDUCED SIDE GATE EFFECT

[75] Inventors: Teruo Yokoyama, Atsugi; Masahisa Suzuki, Tokyo; Tomonori Ishikawa, Fujisawa; Takeshi Igarashi, Atsugi, all of Japan

[73] Assignee: Fujitsu Limited, Kawasaki, Japan

[21] Appl. No.: 976,000

[22] Filed: Nov. 13, 1992

Related U.S. Application Data

[63] Continuation of Ser. No. 617,007, Nov. 21, 1990, abandoned.

[30] Foreign Application Priority Data

Nov. 21, 1989 [JP] Japan .................. 1-302667
Jul. 30, 1990 [JP] Japan .................. 2-199093

[51] Int. Cl.⁵ .............. H01L 29/161; H01L 29/205; H01L 29/225
[52] U.S. Cl. ..................... 257/194; 257/190; 257/499
[58] Field of Search ........... 357/16, 22; 257/190, 257/194, 499

[56] References Cited

U.S. PATENT DOCUMENTS

| | | | |
|---|---|---|---|
| 4,605,945 | 8/1986 | Katayama et al. | 357/22 A |
| 4,733,283 | 3/1988 | Kuroda | 357/16 |
| 4,799,088 | 1/1989 | Hiyamizu et al. | 357/22 A |
| 4,821,090 | 4/1989 | Yokoyama | 357/22 A |
| 4,830,980 | 5/1989 | Hsieh | 357/22 A |
| 4,920,396 | 4/1990 | Sinohara et al. | 357/16 |
| 4,972,239 | 11/1990 | Mihara | 357/91 |
| 4,987,463 | 1/1991 | Goronkin et al. | 357/22 A |

FOREIGN PATENT DOCUMENTS

| | | |
|---|---|---|
| 0180457 | 5/1986 | European Pat. Off. |
| 0201873 | 11/1986 | European Pat. Off. |
| 62-274669 | 11/1987 | Japan ............ 357/22 A |

*Primary Examiner*—Sara W. Crane
*Attorney, Agent, or Firm*—Staas & Halsey

[57] ABSTRACT

A semiconductor integrated circuit including therein a plurality of active devices comprises a semiconductor substrate, a first buffer layer on the substrate, a second buffer layer provided on the substrate and incorporating therein defects with a concentration level substantially larger than the concentration level of the defects in the first buffer layer; a device layer provided on the second buffer layer and being provided with the active devices, and a plurality of unconductive, device isolation regions formed between the active devices such that the device isolation region extends from an upper surface of the device layer toward the substrate at least beyond a lower surface of the device layer.

14 Claims, 17 Drawing Sheets

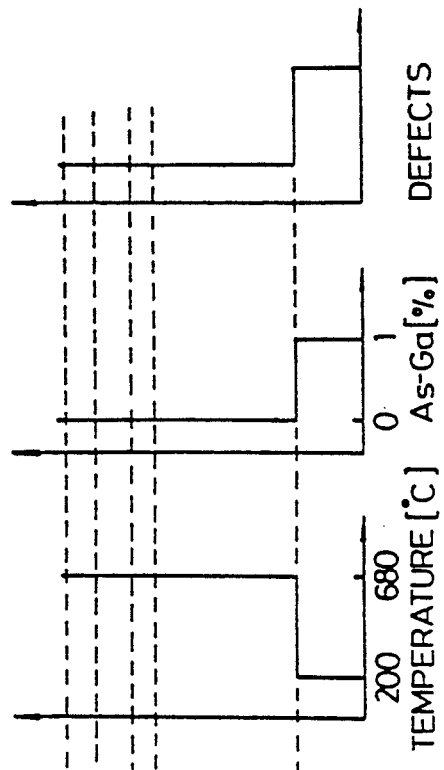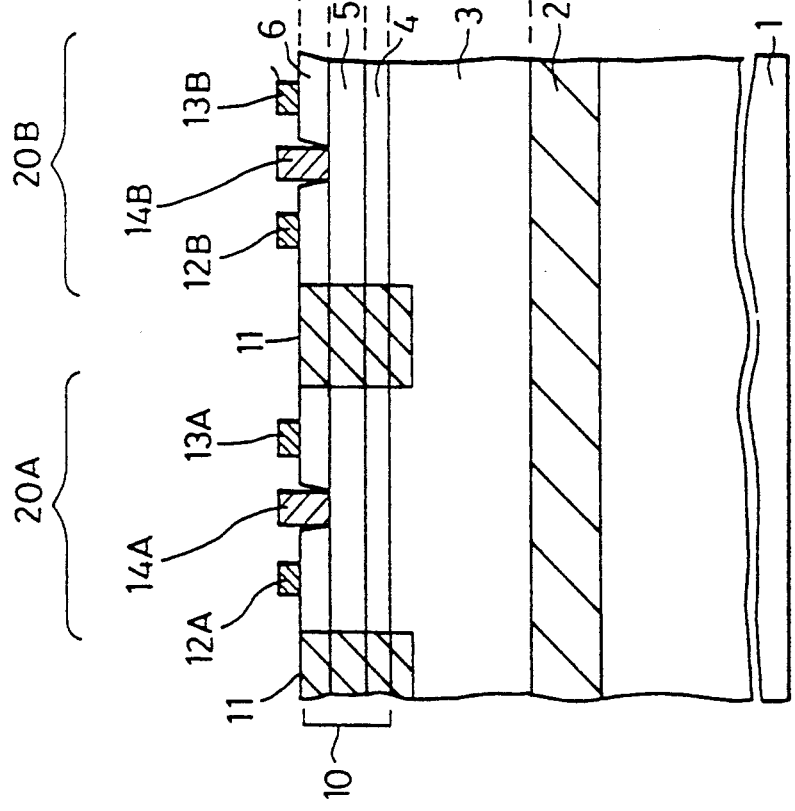

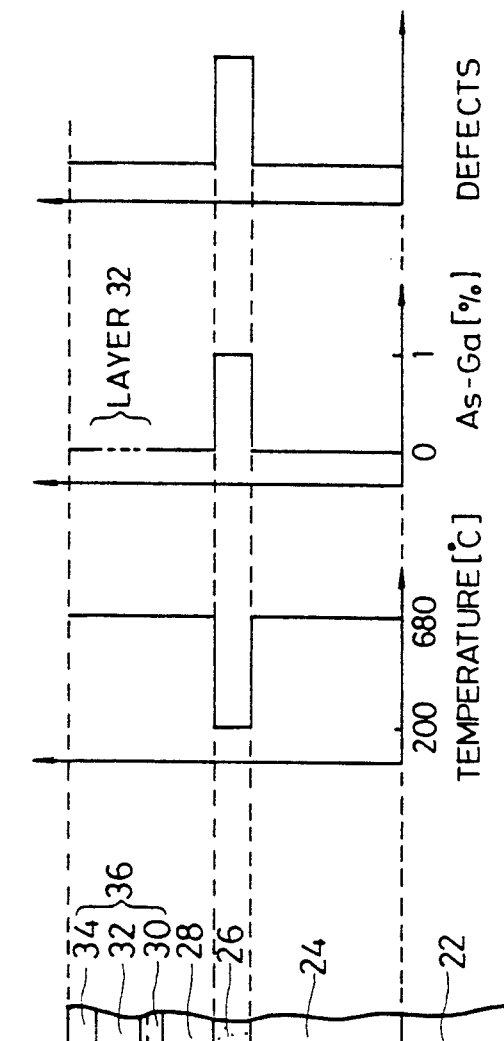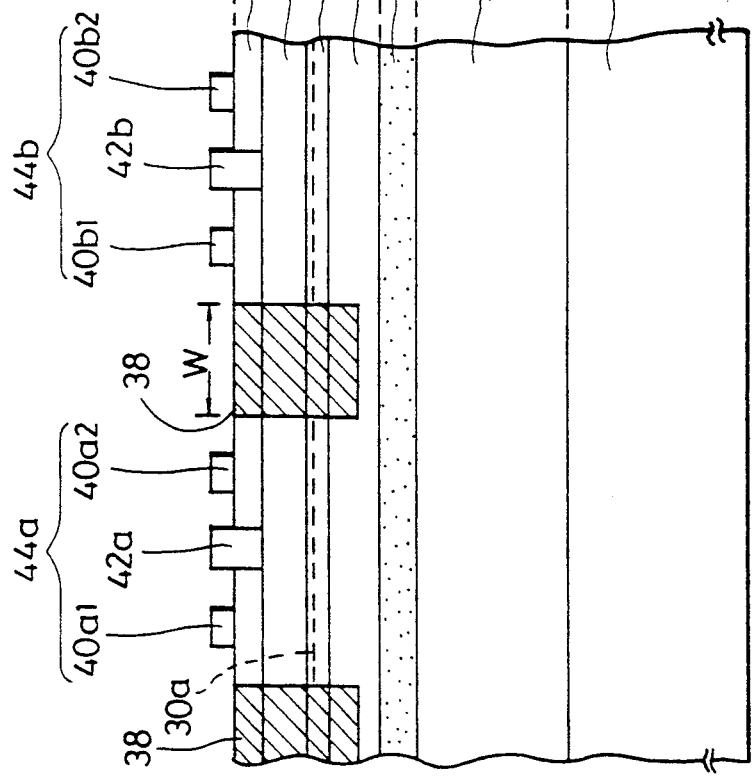

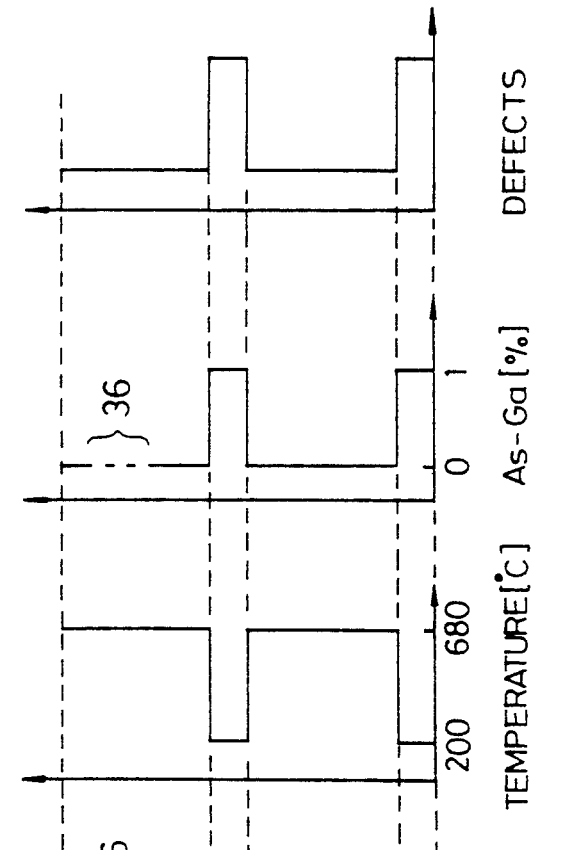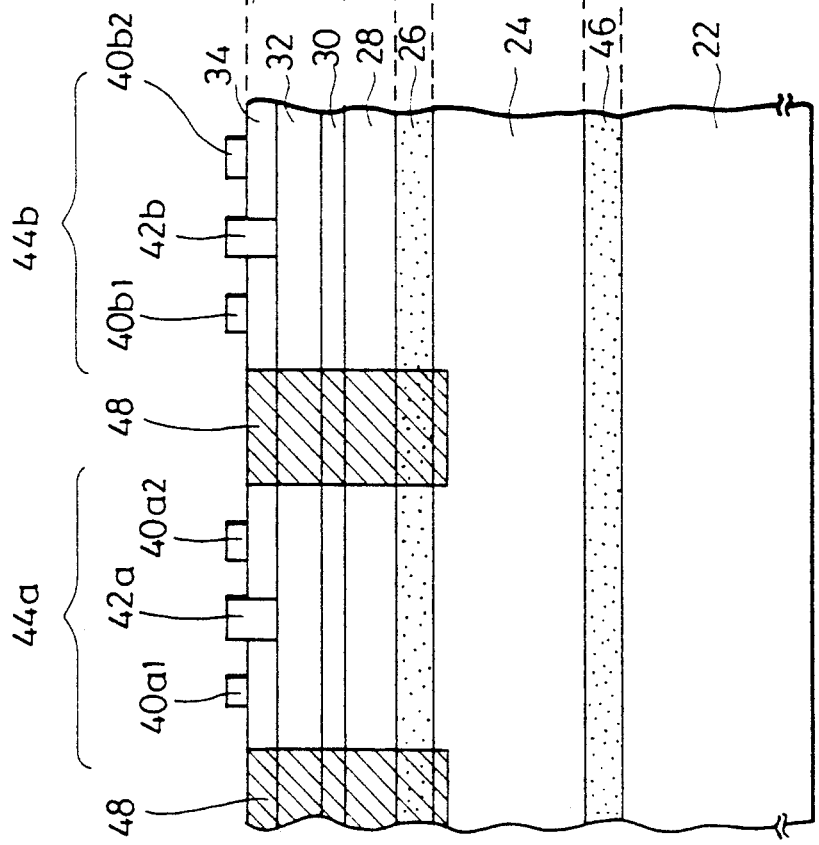

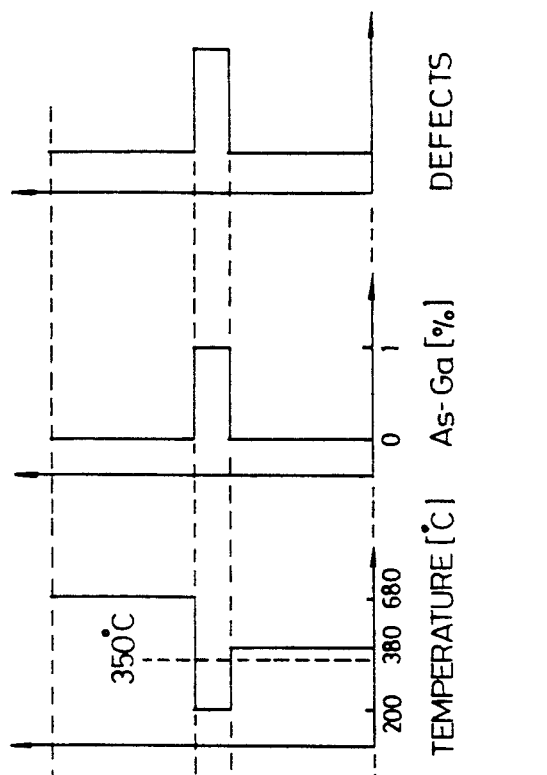
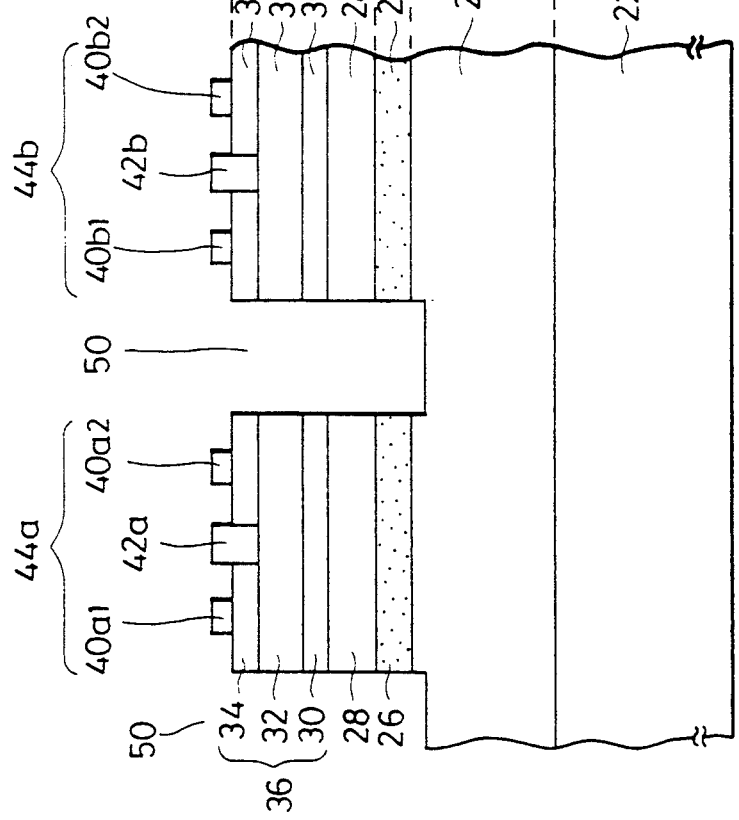

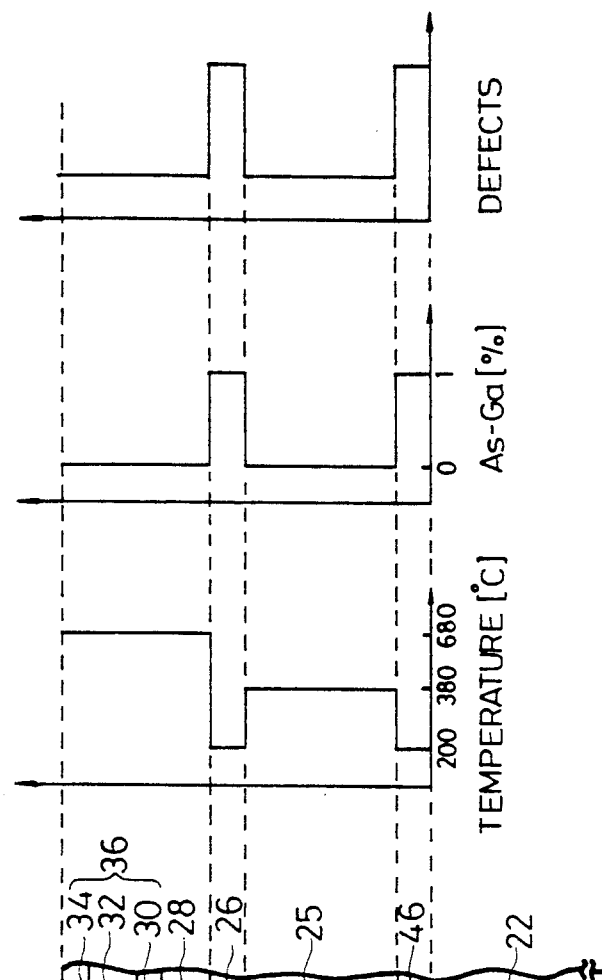
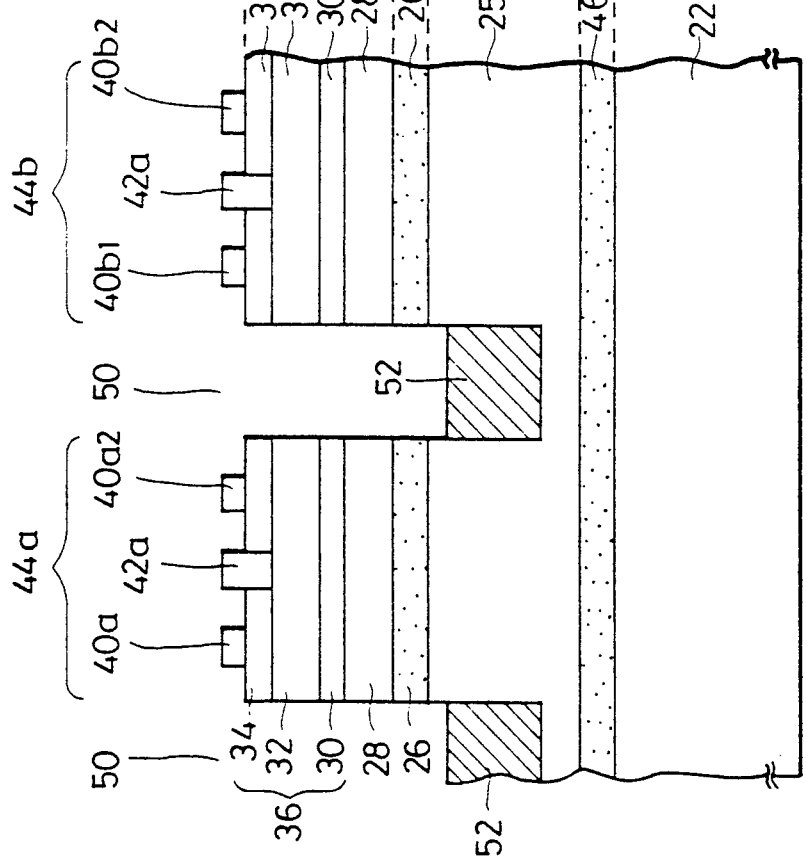

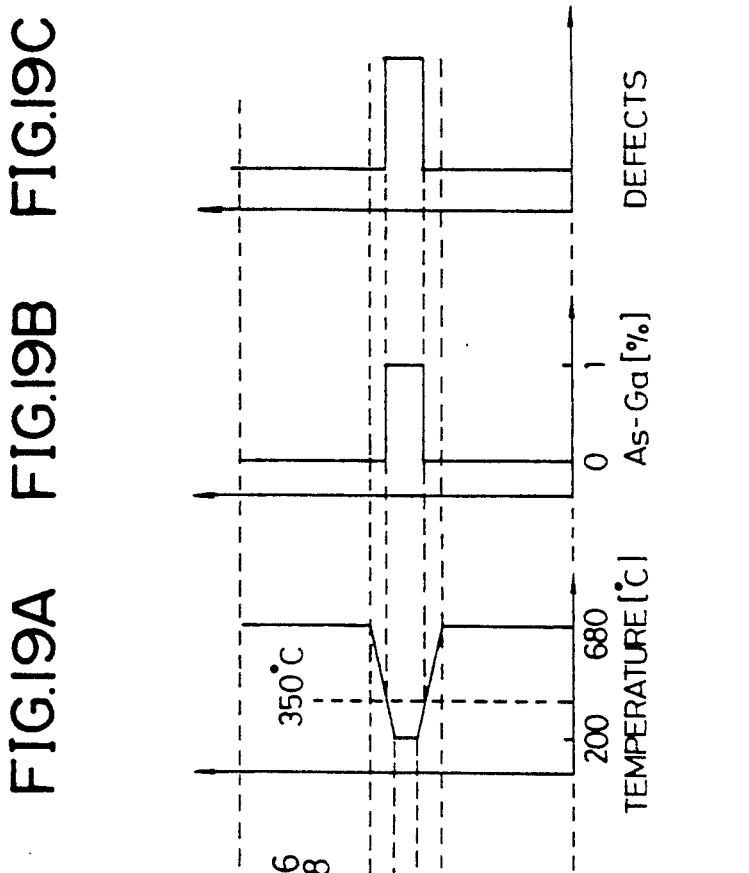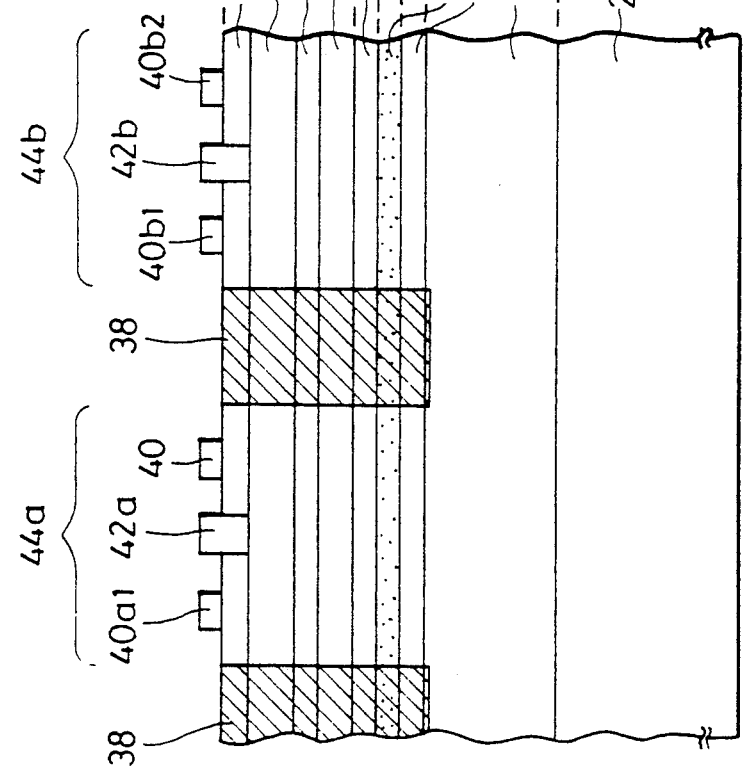

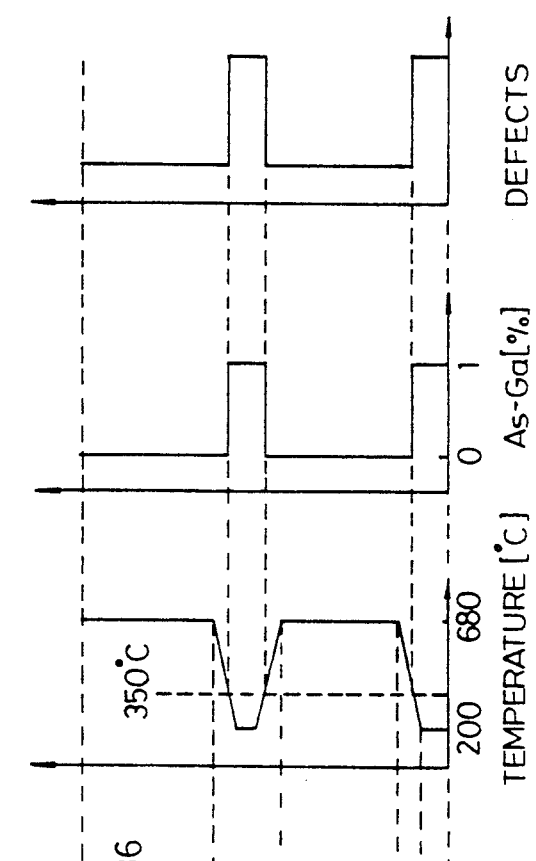
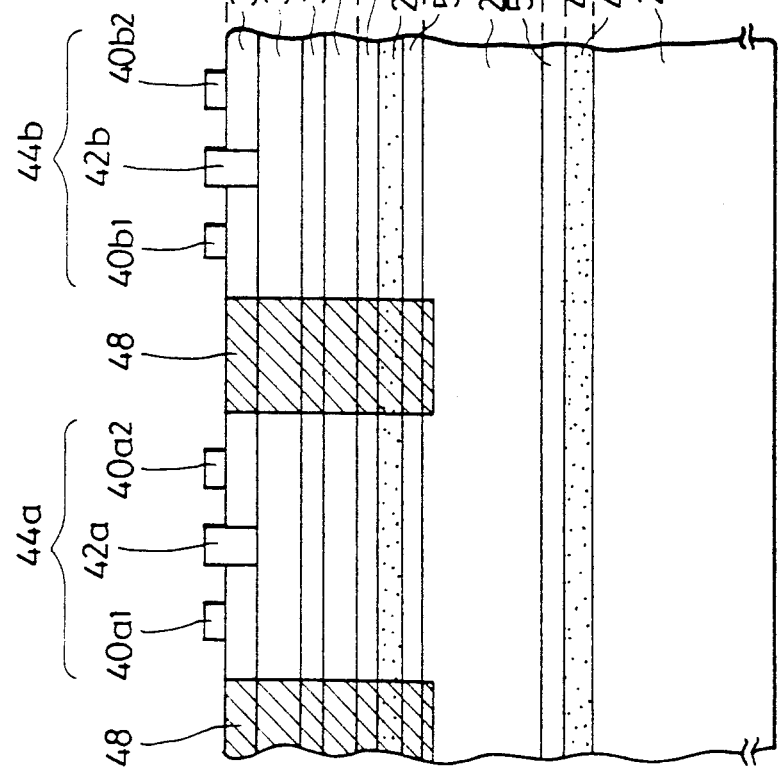

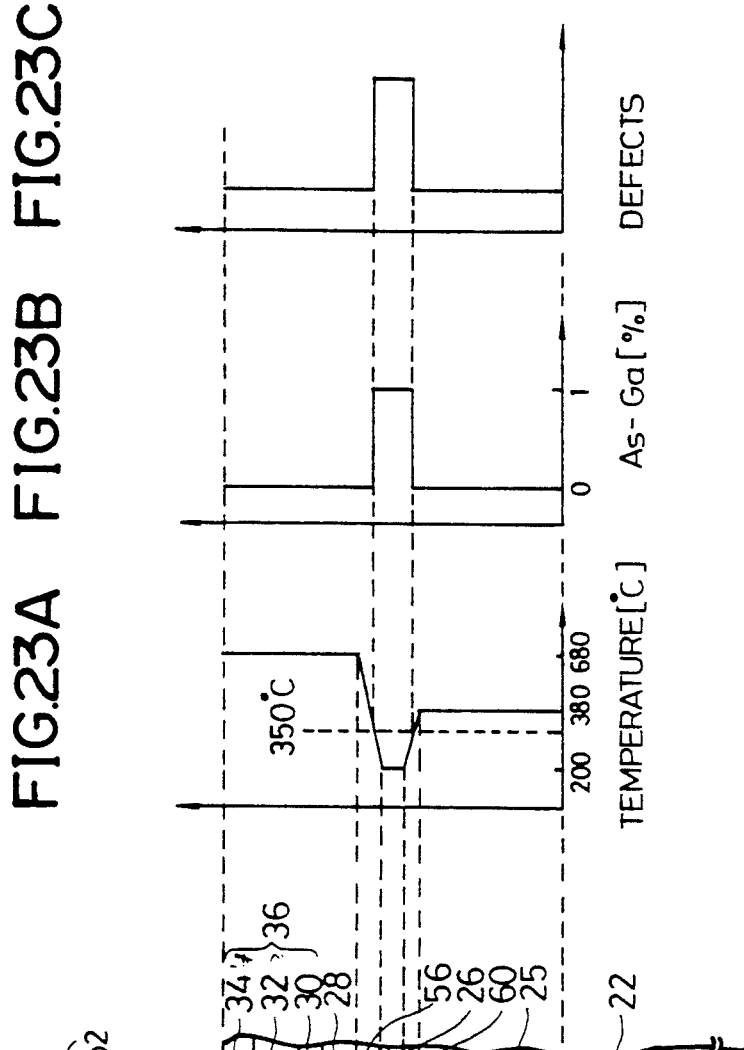
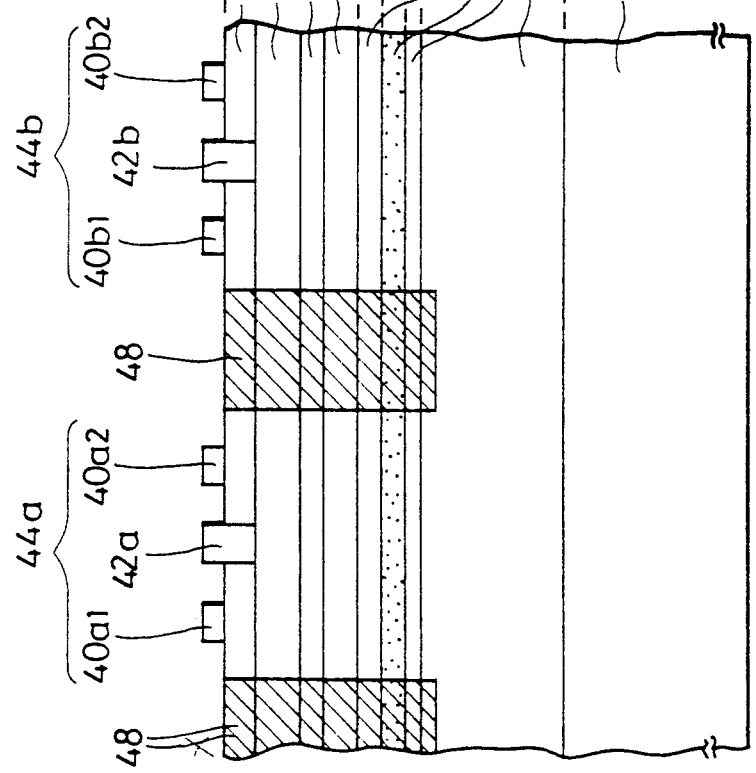

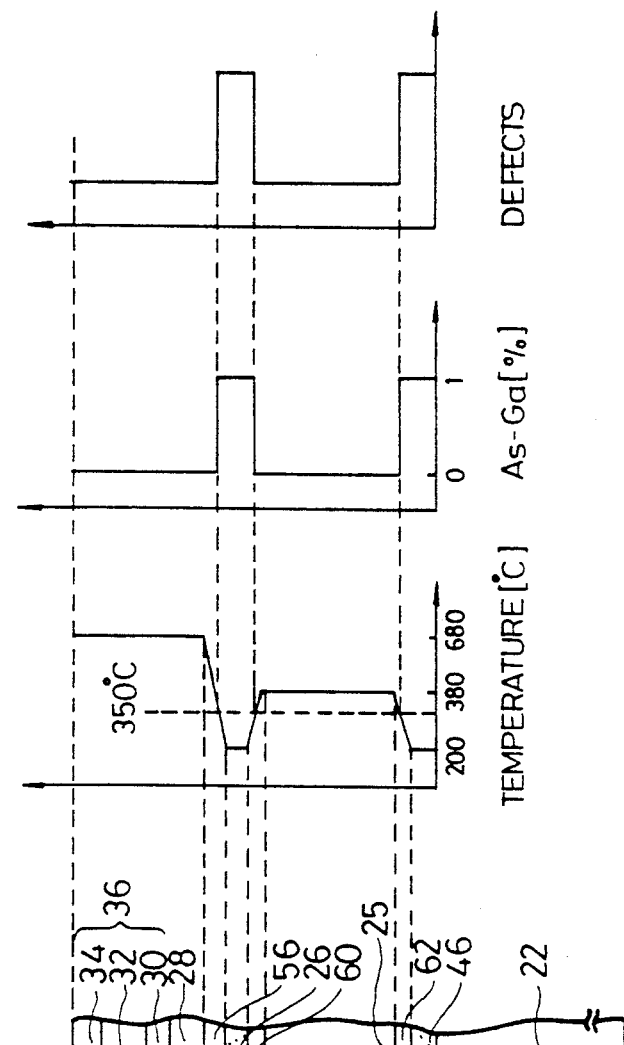
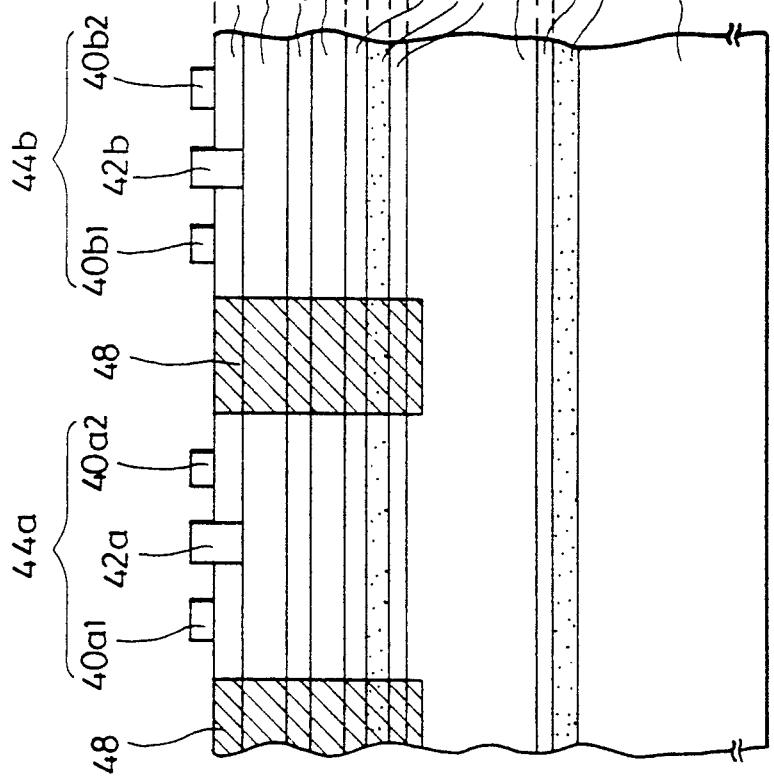
FIG.24
FIG.25A FIG.25B FIG.25C

_5,276,340_

SEMICONDUCTOR INTEGRATED CIRCUIT HAVING A REDUCED SIDE GATE EFFECT

This application is a continuation of application Ser. No. b 07/617,007, filed Nov. 21, 1990.

BACKGROUND OF THE INVENTION

The present invention generally relates to semiconductor integrated circuits and more particularly to a semiconductor integrated circuit of compound semiconductor devices formed on a semi-insulating compound semiconductor substrate.

Compound semiconductor materials such as gallium arsenide, aluminum arsenide, indium phosphide, indium arsenide and the like, are characterized by the high electron mobility and used for super-fast semiconductor devices such as MESFET (metal semiconductor field effect transistor), HEMT (high electron mobility transistor), HBT (heterojunction bipolar transistor) and the like. These semiconductor devices are generally used in the form of integrated circuits wherein a large number of semiconductor devices are assembled on a common substrate. In the integrated circuit of compound semiconductor devices, efforts are made to increase the integration density such that the operational speed of the device is increased further.

Generally, the integrated circuit of compound semiconductor devices uses a semi-insulating compound semiconductor substrate and semiconductor devices are formed thereon with a device isolation region formed therebetween for isolating the individual devices. This device isolation region may be a region of increased resistivity formed by doping impurities that form a deep impurity level in the compound semiconductor material or may be an isolation trench.

When the integration density is increased in such compound semiconductor integrated circuits, it is known that a so-called side gate effect appears wherein the device characteristic such as the threshold voltage of the device in the integrated circuit is changed or modified when a large negative voltage such as the power voltage is applied to an adjacent device in the same integrated circuit. This side gate effect becomes appreciable with increasing integration density and limits the integration density of the integrated circuit.

Various efforts are made in order to eliminate or minimize the side gate effect. FIG. 1, for example, shows the structure of a conventional integrated circuit that has succeeded in eliminating the side gate effect.

The device of FIG. 1 is constructed on a semi-insulating GaAs (gallium arsenide) substrate 1 and includes an undoped, insulating buffer layer of GaAs grown on the GaAs substrate 1 at a temperature of 200° C. It should be noted that the GaAs layer thus grown at a low temperature lower than about 350° C. has a deviation in composition from the ideal GaAs stoichiometry such that the content of As is slightly larger than Ga. Thereby, a large number of defects that cause the trapping of electrons are formed in the buffer layer 2 and the buffer layer 2 shows a large resistivity.

On the buffer layer 2, a second undoped GaAs buffer layer 3 is grown at a temperature of 680° C., and on this second buffer layer 3, the active semiconductor devices are formed. In the illustrated example, the active devices form the HEMT and each device includes an undoped GaAs active layer 4 grown on the buffer layer 3 at 680° C., an electron supplying layer 5 of n-type AlGaAs grown epitaxially on the active layer 4 with the composition of $Al_{0.3}Ga_{0.7}As$, and a cap layer 6 of n-type GaAs grown epitaxially further on the electron supplying layer 5. As is well known, the electron supplying layer 5 and the active layer 4 form a heterojunction at an interface therebetween and there is formed a two-dimensional electron gas in the active layer 4 along the heterojunction.

The layers 4 through 6 are provided commonly to the devices in the integrated circuit, and the individual devices are isolated from each other by a device isolation region 11 that is formed by an ion implantation of oxygen such that the region 11 reaches the buffer layer 3.

After the formation of the device isolation region 11, source electrodes 12A, 12B, ... and drain electrodes 13A, 13B, ... are formed on the cap layer 6. Further, a part of the cap layer 6 corresponding to where the gate electrode is to be formed is removed selectively by etching, and gate electrodes 14A, 14B, .. are provided in correspondence to the recessed parts thus formed.

FIGS. 2A–2C show the temperature of growth used to form the structure of FIG. 1, the compositional deviation from the ideal GaAs stoichiometry in various parts of the structure of FIG. 1, and the number of defects in the structure of FIG. 1, respectively. In FIG. 2B, the deviation of the composition is represented in terms of the difference between the atomic percent of As and that of Ga in the GaAs layer and is supposed to be zero when the material of the layer has the ideal stoichiometry. As will be noted in these drawings, the GaAs buffer layer 2 grown at 200° C. has a deviation in the stoichiometry that reaches as much as about 1 % in terms of the difference in the composition of Ga and As. Associated with this significant deviation in the stoichiometry, there appears a large number of defects in the layer 2 as shown in FIG. 2C. As already noted, such defects in the buffer layer 2 captures the electrons entering into the layer 2 and the layer 2 shows a high resistivity. With the high resistivity layer 2 thus incorporated, the device of FIG. 1 interrupts the leak current path formed between the GaAs substrate 1 and the buffer layer 3, and it is believed that this is the reason the integrated circuit of FIG. 1 is successful in eliminating the side gate effect.

FIG. 3 shows the characteristic of the integrated circuit of FIG. 1 measured at 300° K. In this measurement, the drain current $I_D$ was measured for the HEMT 20A of FIG. 1. In this structure, it should be noted that the buffer layer 2 has a thickness of about 500Å, the buffer layer 3 has a thickness of about 5000Å, and the device isolation region 11 has a width of about 2 μm. The drain current $I_D$ was measured as a function of time while applying a constant drain voltage VD of 1 volt to the drain electrode 13A and simultaneously applying a side gate voltage VG of −5 volts across the source electrode 12B and the drain electrode 13B of adjacent HEMT 20B. As can be seen from FIG. 3, the drain current $I_D$ of the device 20A is stable as long as the device is operated at 300° K. and the side gate effect is satisfactorily eliminated.

The success of the structure of FIG. 1 suggests that the side gate effect is caused as a result of the flow of carriers that somehow enter into the device region of the HEMT 20A in response to the side gate voltage in the HEMT 20B or vice versa through the semi-insulating substrate 1. In the structure of FIG. 1, such a path of the carriers through the substrate 1 is interrupted by the buffer layer 2.

On the other hand, when the device is operated at a low temperature such as 85° K., it was found that the drain current of the HEMT of FIG. 1 decreases exponentially with time when a side gate voltage is applied to the adjacent HEMT. FIG. 4 shows the result of experiment undertaken at 85° K. for the same sample used for the experiment of FIG. 3, under the same experimental condition. The result of FIG. 4 clearly shows that the HEMT of FIG. 1 cannot eliminate the side gate effect when operated at such a low temperature. It should be noted that the electron mobility of the two-dimensional electron gas formed at the heterojunction interface between the layer 4 and the layer 5 and determines the operational speed of HEMT, increases significantly at low temperatures such as 85° K. Therefore, the HEMT of FIG. 1 is potentially capable of exhibiting a performance that is far superior to the performance obtained at the room temperature when operated at low temperatures. Thus, the side gate effect of the device of FIG. 1 occurring at these low temperatures significantly diminishes the performance of the HEMT.

The side gate effect of the foregoing type appearing only at low temperatures is believed to be caused by the defects that are intentionally introduced into the GaAs buffer layer 2. More specifically, when the electrons in the buffer layer 3 are accelerated and entered into the buffer layer 2 as the hot electrons as shown in FIG. 5, these electrons are trapped by the defects in the layer 2. At the room temperature, these trapped electrons are released again in due course due to the thermal energy of the electrons and the accumulation of electrons in the buffer layer 2 does not occur. At the low temperatures such as 85° K., on the other hand, the trapped electrons are no longer released. Thereby, the buffer layer 2 is charged electrically with time and modifies the potential level in the device. Anyway, the conventional HEMT of FIG. 1 could operate satisfactorily only at the room temperature and one cannot exploit the potentially superb performance of the device that is obtained at the low temperature.

Meanwhile, the inventors of the present invention have discovered, in a series of experiments conducted on the device of FIG. 1 and forming one of the basis of the present invention, that the transconductance of the HEMT decreases with increasing thickness of the buffer layer 2 and increases with increasing overall thickness of the buffer layers 2 and 3. FIGS. 6 and 7 show the relationship found by the inventors. As can be seen in FIG. 6, the transconductance remains at about 200 mA/mm as long as the thickness of the GaAs buffer layer 2 is smaller than about 1000Å while decreases rapidly when the thickness exceeds 1000Å. Referring to FIG. 7, on the other hand, the transconductance is smaller than 200 mA/mm when the overall thickness of the layers 2 and 3 is smaller than about 4000Å, while a value exceeding 200 mA/mm is obtained when the overall thickness is set about 4000Å or larger. Thus, the relationship in FIGS. 6 and 7 imposes a certain limitation in the design of the HEMT when one attempts to eliminate the foregoing problem of the side gate effect.

SUMMARY OF THE INVENTION

Accordingly, it is a general object of the present invention to provide a novel and useful semiconductor integrated circuit of compound semiconductor devices wherein the foregoing problems are eliminated.

Another and more specific object of the present invention is to provide a semiconductor integrated circuit including therein a plurality of compound semiconductor devices as active devices, wherein the side gate effect between adjacent active devices is eliminated both at the room temperature and at low temperatures.

Another object of the present invention is to provide a process of fabricating a semiconductor integrated circuit including therein a plurality of compound semiconductor devices isolated with each other as active devices, wherein the throughput at the time of fabrication is increased.

Another object of the present invention is to provide a semiconductor integrated circuit including therein a plurality of active devices, comprising: a semiconductor substrate; a first buffer layer of a compound semiconductor material provided on the substrate, said first buffer layer having a first concentration level of defects and a first resistivity corresponding to the first concentration level of the defects; a second buffer layer of a compound semiconductor material provided on the first buffer layer, said second buffer layer incorporating therein defects with a second concentration level exceeding the first concentration level and having a second resistivity substantially larger than the first resistivity in correspondence to the second concentration level of the defects; a device layer provided on the second buffer layer and being provided with the active devices, said device layer forming a part of the active devices; and a plurality of unconductive, device isolation regions formed between the active devices, each of said device isolation regions being formed such that the device isolation region extends from an upper surface of the device layer toward the substrate at least beyond a lower surface of the device layer. According to the present invention, the leak current path across the adjacent active devices is eliminated or at least restricted by providing the second buffer layer of high resistivity close to the active layer and by extending the device isolation region at least to the vicinity of the second buffer layer. In a preferred embodiment, the device isolation region reaches the second buffer layer. In another aspect, the present invention can guarantee a high transconductance of the active devices by reducing the thickness of the second buffer layer while maintaining the overall thickness of the first and second buffer layers. It was found that the structure of the present invention is effective in suppressing the side gate effect both at the room temperature and the low temperatures.

Another object of the present invention is to provide a process for producing a semiconductor integrated circuit including therein a plurality of compound semiconductor devices as active devices, comprising the steps of: growing a first buffer layer of a first compound semiconductor material on a semiconductor substrate at a first temperature; growing a second buffer layer of a second compound semiconductor material on the first buffer layer at a second temperature lower than the first temperature, said second temperature being chosen to be lower than a predetermined critical temperature pertinent to the second compound semiconductor material above which the second compound semiconductor material involves little defects and below which the second compound semiconductor material involves a large amount of defects; growing an active layer forming a part of the active devices on the second buffer layer at a third temperature that is higher than any of the first and second temperatures; and forming the active devices on the active layer. According to the present invention, the transition from the step of growing the first compound semiconductor material to the step of growing the second compound is achieved with a reduced time because of the small temperature difference between the first temperature and the second temperature. Thereby, the throughput at the time of fabrication of the integrated circuit is significantly improved. It should be noted that a cooling process generally takes a much longer time than a heating process in the apparatus that is used for growing the crystal layers.

Other objects and further features of the present invention will become apparent from the following detailed description when read in conjunction with the attached drawings.

BRIEF DESCRIPTION OF THE DRAWINGS

FIG. 1 is a cross-sectional view showing a typical conventional HEMT integrated circuit;

FIGS. 2A-2C are diagrams showing the temperature of growth of the semiconductor layers used at the time of formation of the structure of FIG. 1, the distribution of composition in the structure of FIG. 1, and the distribution of the defects in the structure of FIG. 1, respectively;

FIG. 8 is a cross-sectional view showing the structure of the semiconductor integrated circuit according to a first embodiment of the present invention;

FIGS. 9A-9C are diagrams showing the temperature of growth of the semiconductor layers used at the time of formation of the structure of FIG. 8, the distribution of composition in the structure of FIG. 8, and the distribution of the defects in the structure of FIG. 8, respectively;

FIG. 11 is a cross-sectional view showing the structure of the semiconductor integrated circuit according to a second embodiment of the present invention;

FIGS. 12A-12C are diagrams showing the temperature of growth of the semiconductor layers used at the time of formation of the structure of FIG. 11, the distribution of composition in the structure of FIG. 11, and the distribution of the defects in the structure of FIG. 11, respectively;

FIG. 13 is a cross-sectional view showing the structure of the semiconductor integrated circuit according to a third embodiment of the present invention;

FIGS. 14A-14C are diagrams showing the temperature of growth of the semiconductor layers used at the time of formation of the structure of FIG. 13, the distribution of composition in the structure of FIG. 13, and the distribution of the defects in the structure of FIG. 13, respectively;

FIG. 15 is a cross-sectional view showing the structure of the semiconductor integrated circuit according to a fourth embodiment of the present invention;

FIGS. 16A-16C are diagrams showing the temperature of growth of the semiconductor layers used at the time of formation of the structure of FIG. 15, the distribution of composition in the structure of FIG. 15, and the distribution of the defects in the structure of FIG. 15, respectively;

FIG. 18 is a cross-sectional view showing the structure of the semiconductor integrated circuit according to a sixth embodiment of the present invention;

FIGS. 19A-19C are diagrams showing the temperature of growth of the semiconductor layers used at the time of formation of the structure of FIG. 18, the distribution of composition in the structure of FIG. 18, and the distribution of the defects in the structure of FIG. 18, respectively;

FIG. 20 is a cross-sectional view showing the structure of the semiconductor integrated circuit according to a seventh embodiment of the present invention;

FIGS. 21A-21C are diagrams showing the temperature of growth of the semiconductor layers used at the time of formation of the structure of FIG. 20, the distribution of composition in the structure of FIG. 20, and the distribution of the defects in the structure of FIG. 20, respectively;

FIG. 22 is a cross-sectional view showing the structure of the semiconductor integrated circuit according to an eighth embodiment of the present invention;

FIGS. 23A-23C are diagrams showing the temperature of growth of the semiconductor layers used at the time of formation of the structure of FIG. 22, the distribution of composition in the structure of FIG. 22, and the distribution of the defects in the structure of FIG. 22, respectively;

FIG. 24 is a cross-sectional view showing the structure of the semiconductor integrated circuit according to a ninth embodiment of the present invention;

FIGS. 25A-25C are diagrams showing the temperature of growth of the semiconductor layers used at the time of formation of the structure of FIG. 24, the distribution of composition in the structure of FIG. 24, and the distribution of the defects in the structure of FIG. 24, respectively;

DETAILED DESCRIPTION

Figure 3:
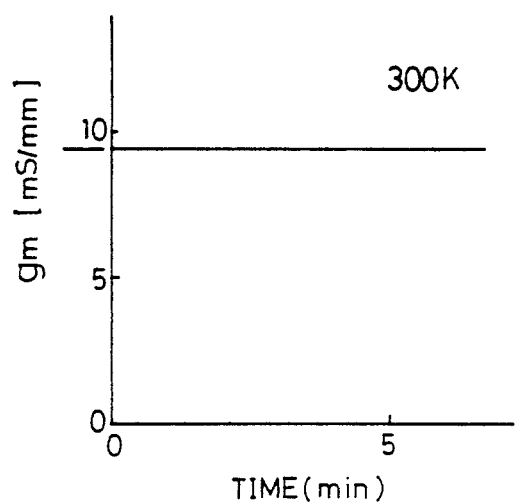
FIG. 3 is a diagram showing the effect of suppressing the side gate effect at the room temperature achieved by the integrated circuit of FIG. 1.

FIG. 8 shows a first embodiment of the present invention. Referring to FIG. 8, the integrated circuit of the present invention is constructed on an undoped semi-insulating GaAs substrate 22 and comprises a first buffer layer 24 of undoped GaAs grown on the substrate 22 with a thickness of 4500Å, a second buffer layer 26 of undoped GaAs grown on the first buffer layer 24 with a thickness of 500Å, and a third buffer layer 28 of undoped GaAs grown on the second buffer layer 26 with a thickness of 800Å.

On the third buffer layer 28, an undoped GaAs layer 30 is grown with a thickness of 200Å as an active layer of the semiconductor devices formed on the integrated circuit. Further, an electron supplying layer 32 of n-type AlGaAs, having a composition of $Al_{0.3}Ga_{0.7}As$ and doped by Si to a level of $1.5 \times 10^{18} cm^{-3}$, is grown on the active layer 30 with a thickness of 500Å. Finally, an n-type cap layer of GaAs 34 is grown on the electron supplying layer 32. Thereby, a two-dimensional electron gas 30a is formed in the active layer 30 along the interface to the electron supplying layer 32 as is well known in the art. The layers 30, 32 and 34 form a device layer 36 that supports and takes a part in the operation of the active devices on the integrated circuit.

The growth of the semiconductor layers may be achieved by the molecular beam epitaxy (MBE) process wherein the growth of the first buffer layer 24 is made at 680° C., the growth of the second buffer layer 26 is made at 200° C., and the growth of the layers 28 through 34 is made at 680° C.

Next, an ion plantation of ions such as O+ that causes a trapping of electrons when entered into the compound semiconductor material, is undertaken such that there is formed an inactivated region 38 in the structure. The region 38 is formed to extend from the surface of the cap layer 34 until it reaches the third buffer layer 28 and the two dimensional electron gas 30a is segmented by the region 38. Thereby, a number of device regions 44a, 44b, etc. are defined in the structure isolated with each other by the region 38. Thus, the region 38 acts as the device isolation region.

On the GaAs cap layer 34, there is provided a conductor layer not illustrated by depositing alternately a gold-germanium alloy and gold, and after patterning the conductor layer in each device region, electrodes 40a1 and 40a2 establishing an ohmic contact with the underlying GaAs cap layer 34 are formed in correspondence to the device region 44a as the source and the drain electrodes respectively. Similarly, in the device region 44b, electrodes 40b1 and 40b2 are formed as the source and the drain electrodes respectively by the patterning of the conductor layer. Further, the cap layer 34 is patterned in correspondence to where a gate electrode is to be formed for each of the device regions 44a, 44b, . . . such that a part of the electron supplying layer 32 is exposed as a result of the etching, and there are formed gate electrodes 42a and 42b of a metal such as Al such that the gate electrodes make a Schottky contact with the underlying electron supplying layer 34 in correspondence to the device region 44a and the device region 44b, respectively. After the formation of the electrodes, an interlayer insulation and interconnection conductor patterns not illustrated are provided.

The active devices 44a and 44b thus formed in the device layer 36 are known as HEMT and characterized by the super-fast operational speed. As is well known, such a remarkable characteristic is obtained as a result of use of the two-dimensional electron gas 30a that supports a substantially scatter-free transport of electrons.

In the structure thus obtained, it should be noted that the second buffer layer 26 grown at 200° C. incorporates therein a significant amount of defects because of the reduced temperature of growth. FIG. 9A shows the temperature control employed for the growth of each semiconductor layers in the structure of FIG. 8. As already described, GaAs shows a deviation from the ideal stoichiometry when grown at a temperature lower than a critical temperature of about 350° C. As a matter of fact, it was found that the composition of the GaAs buffer layer 26 is represented as $Ga_{49.5}As_{50.5}$ and thus shows a significant deviation from the ideal stoichiometry. The difference between the content of Al and that of Ga, representing the degree of deviation, reaches as much as one percent. FIG. 9B shows the difference in the content of Ga and As in the GaAs layers in the structure of FIG. 8 obtained.

When there is such a significant deviation from the ideal stoichiometry in the GaAs buffer layer 26, a large amount of defects are inevitably introduced in the layer 26 as a result of occupation of the Ga-site by the As atoms and the like, and the buffer layer 26 shows a high level of defects as shown in FIG. 9C. It should be noted that FIG. 9C shows the concentration profile of defects in the structure of FIG. 8 in an arbitrary scale. As such defects introduced in the GaAs buffer layer 26 trap electrons, the buffer layer 26 shows a high resistivity and behaves like an insulating layer. With the provision of the insulating GaAs buffer layer 26, the breakdown characteristic of the HEMT on the integrated circuit is significantly improved and the integrated circuit operates properly even when a large electric field is applied therein.

Figure 4:
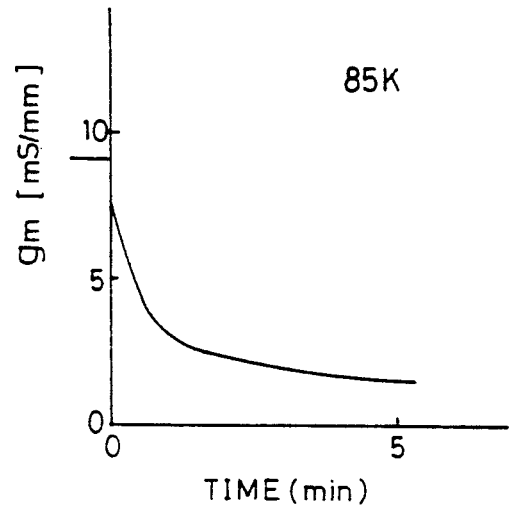
FIG. 4 is a diagram showing the side gate effect appearing in the integrated circuit of FIG. 1 at 85° K.
Figure 10A:
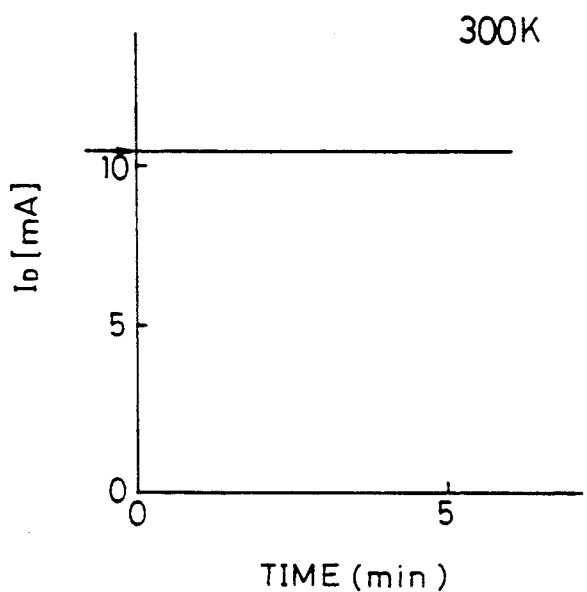
FIGS. 10A and 10B are graphs respectively showing the effect of suppression of the side gate effect at the room temperature and at 85° K.
Figure 10B:
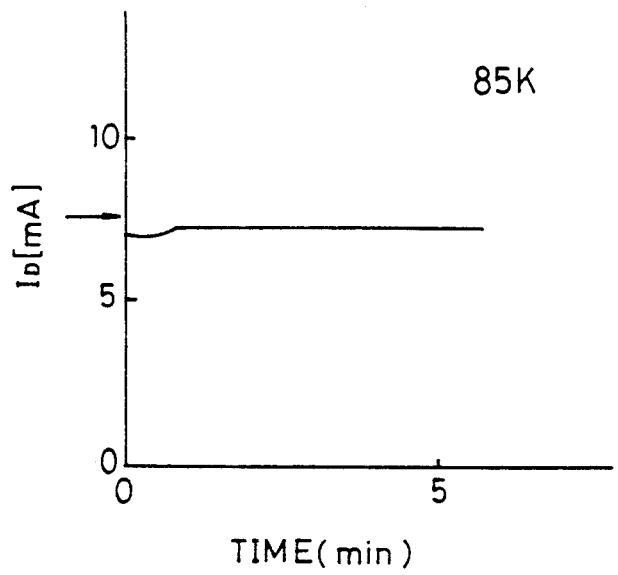

FIGS. 10A and 10B show the result of experiments undertaken for the integrated circuit of FIG. 8 in comparison with the result of FIGS. 3 and 4 cited previously, wherein FIG. 10A shows the result obtained at 300° K. and FIG. 10B shows the result obtained at 85° K. In any of the experiments of FIG. 10A and FIG. 10B, the drain current $I_D$ was measured for the HEMT 44a with time while applying a drain voltage of 1 volt to the drain electrode 40a2. During the measurement, a side gate voltage of $-5$ volts was applied similarly to the case of the experiment of FIGS. 3 and 4. The device isolation region 38 had a width W of 2 μm similarly to the case of FIGS. 3 and 4.

As is clearly demonstrated in FIG. 10A, the integrated circuit of the present embodiment is entirely free from the side gate effect similarly to the case of FIG. 3. In addition, as clearly shown in FIG. 10B, the drain current is substantially constant, except for a small dip immediately after the start of experiment even when operated at a low temperature such as 85° K. In other words, the semiconductor integrated circuit of the present invention can substantially eliminate the side gate effect even when operated at low temperatures.

Figure 6:
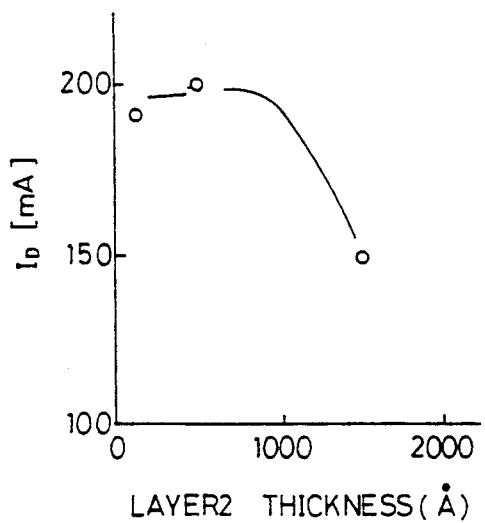
FIG. 6 is a graph showing the relationship between the transconductance of HEMT in the integrated circuit of FIG. 1 and the thickness of an insulating buffer layer used in the structure of FIG. 1.
Figure 7:
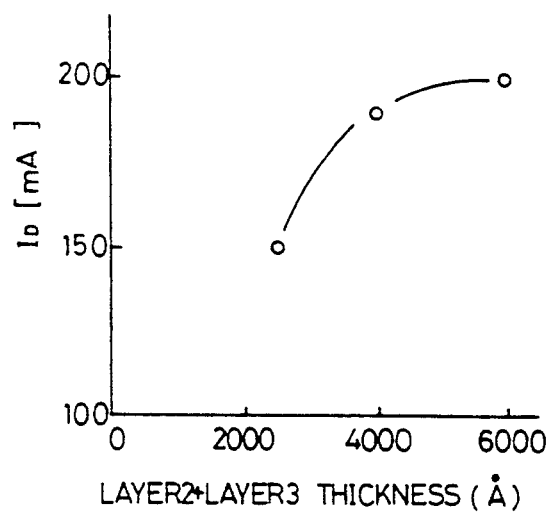
FIG. 7 is a graph showing the relationship between the transconductance of HEMT in the integrated circuit of FIG. 1 and the overall thickness of the buffer layers used in the structure of FIG. 1.
Figure 5:
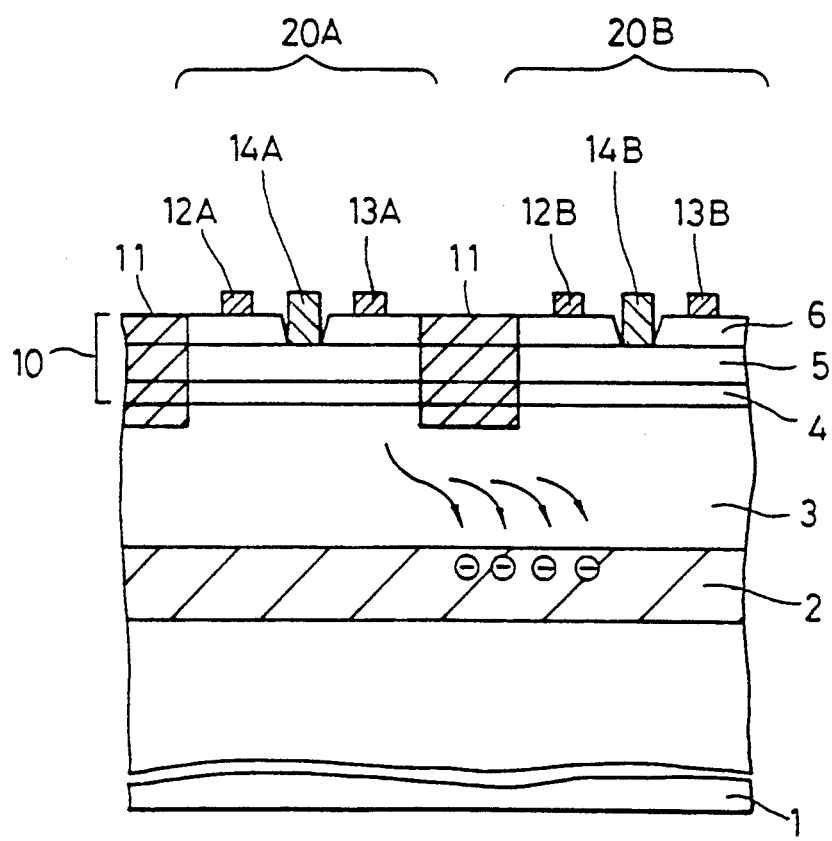
FIG. 5 is a diagram similar to FIG. 1 showing the possible mechanism of the side gate effect shown in FIG. 4.

In the present embodiment, it should be noted that the overall thickness of the buffer layers 24, 26 and 28 are set to be larger than 5000Å by choosing the thickness of the buffer layer 24 as large as 4500Å and by providing another buffer layer 28 having the thickness of 800Å, respectively. On the other hand, the thickness of the insulating buffer layer 26 is set to be as thin as 500Å. Thereby, a large transconductance $g_m$ is guaranteed in view of the relationship of FIGS. 6 and 7 found by the inventors of the present invention. Further, an effective restriction of the leak current path is achieved by the present invention by providing the thin insulating buffer layer 26 at the top part of the thick buffer layer 24 such that the layer 26 is located close to the device isolation region 38.

Next, a second embodiment of the present invention will be described with reference to FIG. 11 and FIGS. 12A–12C. In the drawings, these parts that are described previously are given identical reference numerals and the description thereof will be omitted.

In this embodiment, there is provided a device isolation region 48 such that the region 48 extends from the top surface of the cap layer 34 and reaches the second buffer layer 26. In the illustrated example, the isolation region 48 extends beyond the lower boundary of the buffer layer 26 and enters into the first buffer layer. Thereby, the leak current path across the adjacent devices is completely shutdown and the side gate effect caused by the leak current is decreased to almost one-tenth as compared to the case of the first embodiment. In other words, the present embodiment can eliminate the leak current almost completely. The region 48 may be formed by the ion implantation of impurities such as oxygen forming a deep donor level in the compound semiconductor material.

Another feature of the present embodiment is that there is provided another buffer layer 46 of undoped GaAs between the substrate 22 and the first buffer layer 24. This buffer layer 46 is grown at 200° C. as shown in FIG. 12A similarly to the buffer layer 26 and thus incorporates therein a large amount of defects. FIGS. 12A–12C corresponds to FIGS. 9A–9C and shows that the layer 46 is grown at 200° C. (FIG. 12A) and contains therein a large amount of defects (FIG. 12C) due to the deviation from the ideal stoichiometry of GaAs (FIG. 12B). The layer 46 may have a thickness of 500Å. With the provision of the layer 46 at the boundary between the semi-insulating GaAs substrate 22 and the GaAs buffer layer 24, the existence of p-type region that is formed on the top surface of the GaAs substrate 22 as a result of incorporation of carbon atoms into the surface region of the substrate 22 is effectively shielded and the leak current that flows across the device regions 44a and 44b along such p-type region of the substrate is eliminated.

Next, a third embodiment of the present invention will be described with reference to FIG. 13 and FIGS. 14A–14C, wherein FIGS. 14A–14C corresponds to FIGS. 9A–9C or FIGS. 12A–12C described previously.

In this embodiment, the first buffer layer 24 is replaced by an undoped GaAs buffer layer 25 also having the thickness of 4500Å. The difference between the buffer layer 25 and the buffer layer 24 is that the former is grown at a temperature of 380° C. in contrast to the latter that is grown at 680° C. See the process temperature chart of FIG. 14A. In the layer 25, too, the amount of defects introduced therein is very small, as the temperature of growth still exceeds the critical temperature of 350° C. below which the amount of defects in the grown GaAs layer increases significantly.

By choosing the growth temperature of the buffer layer 25 as such, the transition process of the device fabrication from the step of growing the first buffer layer to the step of growing the second buffer layer, that accompanies the temperature decrease from 680° C. to 200° C. in the case of the first embodiment, is significantly shortened, as the necessary decrease of temperature is only 180° C. in the case of the third embodiment. As the transition process, generally characterized by the natural cooling process, is slow because of the large heat content of the apparatus, particularly the wafer holder used for the crystal growth, the reduction in the magnitude of the temperature decrease in the foregoing transition process significantly facilitates the throughput of the device fabrication. In other words, the integrated circuit of the present embodiment is suited for efficient production of the integrated circuit.

Another feature of the present embodiment is that the device isolation region 38 of the first embodiment is now replaced by an isolation trench 50 that extends from the top surface of the cap layer 34 to the upper part of the buffer layer 25. Typically, the isolation trench 50 is formed by a chemical etching process. Thereby, the isolation trench 50 completely blocks the carriers that are injected from an adjacent HEMT upon the application of the side gate voltage, and the side gate effect caused by these carriers is nearly completely eliminated. Further, as the insulating second buffer layer 26 is isolated from each other by the isolation trench 50, the lateral component of the electric field that is applied to the buffer layer 26 is eliminated and the layer 26 is applied only with the electric field acting in the vertical direction. Thereby, a further improved device isolation is obtained. In this embodiment, the device isolation is achieved as long as the trench 50 extends beyond the two-dimensional electron gas 30a (not shown) and reach the buffer layer 26. In order to achieve a more complete isolation of the devices, however, it is preferred to provide the trench 50 such that the trench extends beyond the buffer layer 26.

Next, a fourth embodiment of the present invention will be described with reference to FIG. 15 and FIGS. 16A–16C. In the drawings, these parts that are identical with the parts described already with reference to the preceding drawings are given identical reference numerals and the description thereof will be omitted.

The structure of FIG. 15 is a modification of the structure of FIG. 13, and the fourth GaAs buffer layer 46 described previously with reference to FIG. 11 is provided between the substrate 22 and the GaAs buffer layer 25. Thereby, the temperature of growth of the semiconductor layers in the structure of FIG. 15 is changed as shown in FIG. 16A. First, the buffer layer 46 is grown on the substrate 22 at 200° C. Next, the temperature is raised to a temperature above 350° C. such as 380° C. and the buffer layer 25 is grown on the buffer layer 46. After the growth of the buffer layer 25, the temperature is decreased to a temperature of 200° C. and the growth of the layer 26 is made. Next, the temperature is increased to 680° C. and the growth of the third buffer layer 28 and the growth of the device layer 36 including the active layer 30, the electron supplying layer 32 and the cap layer 34 are made successively. In this procedure, the process of decreasing the temperature of the apparatus used for the crystal growth is repeated twice. As the range of the temperature decrease is only 180° C. in the present embodiment, the time needed to adjust the temperature of the crystal growth is substantially shortened and a high throughput is obtained at the time of fabrication of the device.

Another feature of the present embodiment is that the device isolation is achieved by the isolation trench 50 similarly to the case of the embodiment of FIG. 13 and that there is further provided an insulation region 52 of undoped GaAs in correspondence to the bottom part of the isolation trench 50. Preferably, this insulation region 52 is formed by implanting O+ into the layer 25 under an acceleration voltage of about 100 keV and a dose of $10^{12} cm^{-2}$. Thereby, the electrons in the region 52 are trapped by the oxygen thus implanted and the region 52 shows a high resistivity. In this construction, the leak current that flows along the bottom surface of the isolation trench 50 is effectively eliminated by the insulating region 52 and thereby the leak current flowing across the isolation trench 50 is decreased to 1/10 of the case of the first embodiment shown in FIG. 8.

Next, a fifth embodiment of the present invention will be described with reference to FIGS. 17A and 17B. In these drawings, the parts that are identical with those already described are given identical reference numerals and the description will be omitted.

Figure 17A:
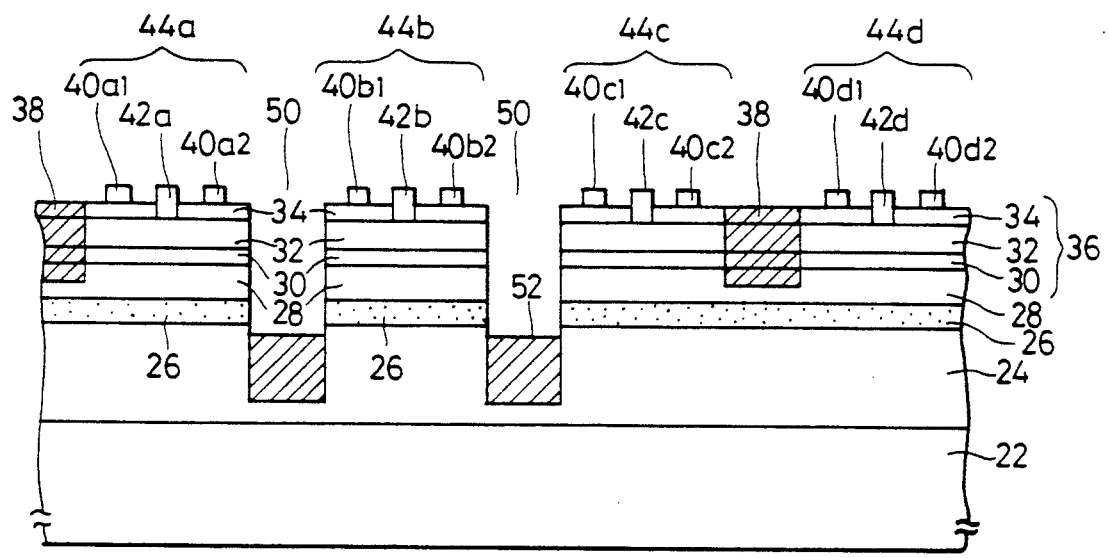
FIG. 17A is a cross-sectional view showing the structure of the semiconductor integrated circuit according to a fifth embodiment of the present invention.

Referring to FIG. 17A, there are a number of HEMTs 44a, 44b, 44c and 44d formed on the common substrate 22, wherein the HEMT 44b that is applied with a large negative power voltage is isolated by the isolation trench 50 and the insulating region 52 at the bottom of the trench 50 similarly to the embodiment of FIG. 15. On the other hand, other HEMTs 44a, 44c and 44d to which the large negative voltage is not applied are isolated by the isolation region 38 that is formed by the ion implantation of O+, except of course for the side facing the HEMT 44b where the foregoing isolation trench 50 is formed. Each HEMT includes the device layer 36 comprised of the active layer 30, the electron supplying layer 32 and the cap layer 34, and is constructed on the third buffer layer 28 that is provided on the second buffer layer 26 that in turn is provided on the first buffer layer 24.

Figure 17B:
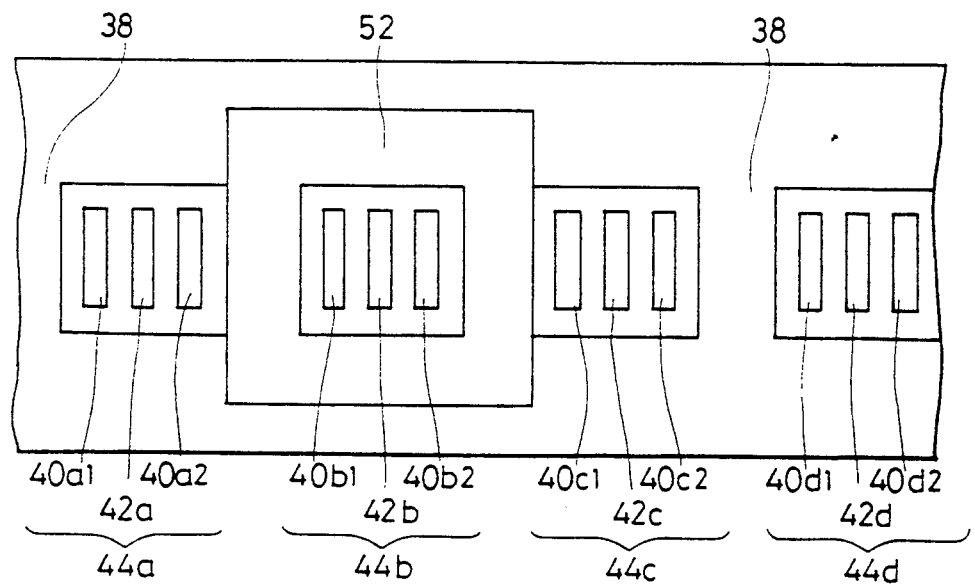
FIG. 17B is a plan view corresponding to the structure of FIG. 17A.

As can be seen in the plan view of FIG. 17B that corresponds to the cross-sectional view of FIG. 17A, the isolation trench 52 is formed to surround the device region 44b, and the entire devices 44a–44d including the isolation trench 52 are surrounded by the isolation region 38. The structure of the present embodiment is particularly effective for eliminating the side gate effect because of the reduced number of fabrication steps by providing the isolation trench 50 and the insulation region 52 only around the device that is applied with a large negative voltage and becomes the source of the side gate effect. Further, the present invention facilitates the planarization of the insulation layer provided on the illustrated structure by reducing the location where the isolation trenches are provided. In the present embodiment, the buffer layer 46 is not provided between the substrate 22 and the buffer layer 24. However, this is not a prerequisite and the layer may be provided between the substrate 22 and the layer 24 similarly to the case of the embodiment of FIG. 15. Of course, an effective elimination of the side gate effect is achieved by providing the isolation trench also around the HEMTs other than the HEMT 44b. Furthermore, the suppression of the side gate effect is achieved even when the isolation trench 52 formed about the HEMT 44b does not surround the device 44b completely.

Next, a sixth embodiment of the present invention will be described with reference to FIG. 18 and FIGS. 19A–19C. In these drawings, those parts that correspond to the parts already described with reference to the preceding drawings are given identical reference numerals and the description thereof will be omitted.

In this embodiment, the growth of the semiconductor layers is made continuously without interruption. It should be noted that, in the case of the integrated circuit of the preceding embodiments, the growth of the semiconductor layer is interrupted during the transition process for decreasing or increasing the temperature of growth. For example, in the case of the first embodiment, the growth of the buffer layer 26 is not started after the growth of the buffer layer 24 is completed, until the temperature of the apparatus used for growing the crystal layers reach 200° C. Similarly, the growth of the buffer layer 28 is not commenced even after the growth of the buffer layer 26 is completed, until the temperature of the apparatus reaches 680° C. It is believed that such interruption of the growth of the semiconductor layers may increase the chance that the exposed top surface of the grown semiconductor layer is modified somehow and causes problems in the subsequent growth of the semiconductor layers thereon.

In the present embodiment, the temperature of growth is gradually and continuously decreased from 680° C. once the growth of the buffer layer 24 is completed as shown in FIG. 19A, while continuing the deposition of undoped GaAs. Thereby, a transition zone 54 is formed on the buffer layer 24. When the temperature has decreased to 200° C., the temperature is held constant and the growth of the buffer layer 26 is made in succession. Further, when the growth of the buffer layer 26 is completed, the temperature is gradually and continuously increased up to 680° C. Thereby, another transition zone 56 is formed. When the temperature has reached 680° C., the temperature is held constant and the growth of the buffer layer 28 and the device layer 36, including the layers 30, 32 and 34, are made without interruption. Thus, there is no interruption of growth in the formation of the structure of FIG. 18.

As can be seen in FIG. A, the temperature of growth decreases below 350° C. during the transitional process of decreasing the temperature from 680° C. to 200° C. In correspondence to this, the transition zone 54 below the buffer layer 26 shows the deviation in the stoichiometry particularly at the upper portion thereof that was grown at a temperature below 350° C. See the plot of FIG. 19B. Similarly, in correspondence to the increase in the temperature of crystal growth, the upper transition zone 56 shows the deviation from the ideal stoichiometry in correspondence to the part that was grown at a temperature below 350° C. The buffer layer 26 of course shows the deviation as shown in FIG. 19B.

In correspondence to the deviation in the stoichiometry shown in FIG. 19B, the defects are introduced as shown in FIG. 19C and thereby there is formed an insulating buffer region including the buffer layer 26 and the part of the transition zones 54 and 56 adjacent to the buffer layer 26. This insulating buffer region acts similarly to the buffer layer 26 of the previous embodiments.

FIG. 20 and FIGS. 21A–21C show a seventh embodiment corresponding to a modification of the embodiment of FIG. 11, wherein the transition from the step of growing the buffer layer 46 to the step of growing the buffer layer 24 is made continuously and gradually as shown in FIG. 21A. Similarly to the case of the embodiment of FIG. 18, there is formed a transition zone 58 (FIG. 20) above the buffer layer 46 and below the buffer layer 24, wherein the part of the transition zone 58 that was grown below 350° C. includes a large number of defects as shown in FIG. 21C in correspondence to the deviation from the ideal GaAs stoichiometry as shown in FIG. 21B. In this structure, too, an effective suppression of the side gate effect similar to that of the embodiment of FIG. 11 is achieved.

FIG. 22 and FIGS. 23A–23C show an eighth embodiment of the present invention. In these drawings, the parts that correspond to the parts described previously with reference to the preceding drawings are given identical reference numerals and the description thereof will be omitted.

In this embodiment, the growth of the semiconductor layers is made successively without interruption similar to the foregoing embodiment of FIG. 20. Thus, the buffer layers 25, 26 and 28 are grown continuously while changing the temperature of the growth. The buffer layer 25 is grown at 380° C. similarly to the case of the preceding embodiments. In response to the transition of the temperature from 380° C. to 200° C., there is formed a transition zone 60 between the buffer layer 25 and the buffer layer 26, and in response to the transition of the temperature from 200° C. to 680° C., there is formed another transition zone 56 between the buffer layer 26 and the buffer layer 28 as illustrated in FIG. 22.

As shown in FIG. 23B, the buffer layer 26 and the part of the transition zones 56 and 60 that was grown below 350° C. show the deviation in the composition from the ideal stoichiometry of GaAs. In correspondence to this deviation in the stoichiometry, there are formed defects as illustrated in FIG. 23C.

It will be understood that this embodiment combines the advantageous feature of the high throughput and the reliable quality of the semiconductor layers that are grown without interruption.

FIG. 24 and FIGS. 25A–25C show a ninth embodiment of the present invention, wherein there is added the GaAs buffer layer 46 to the structure of FIG. 22. Similarly to the foregoing embodiments, the GaAs buffer layer 46 is grown at 200° C. on the GaAs substrate 22.

As shown in FIG. 25A, the transition of the temperature of growing the semiconductor layers is made continuously in this embodiment and thus, there is formed a transition zone 62 in correspondence to the step of raising the temperature from 200° C. to 380° C., in addition to the transition zones 56 and 60 described already. As other features are apparent from the foregoing embodiments, further description of the present embodiment will be omitted.

Figure 26:
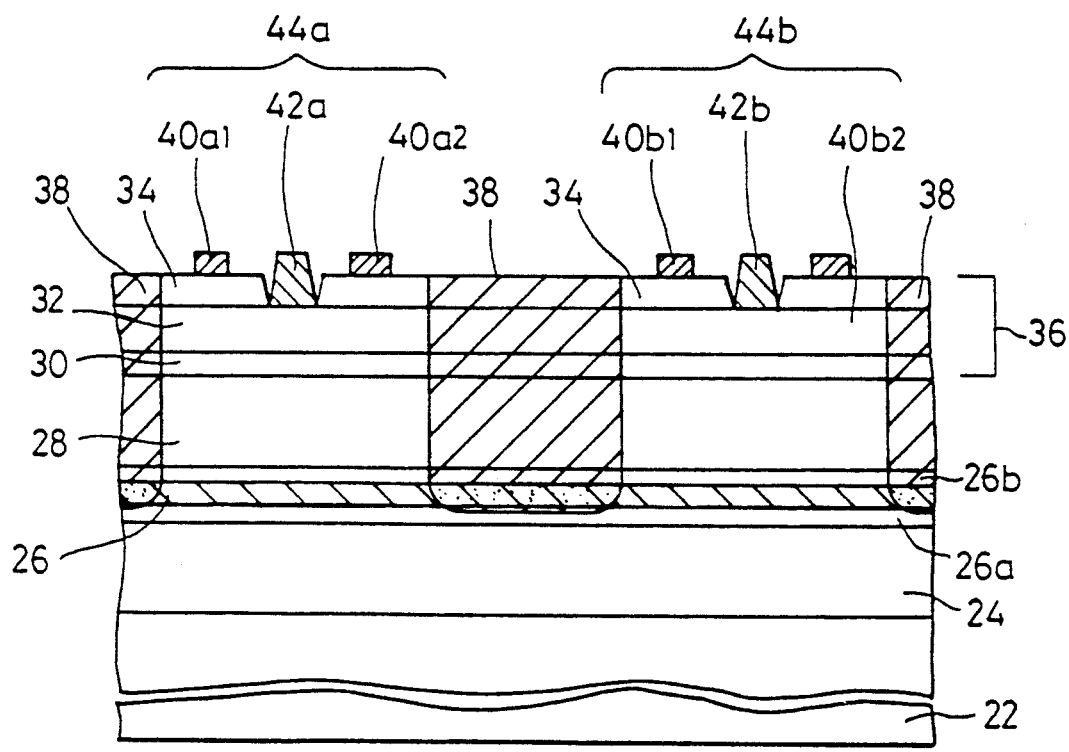
FIG. 26 is a cross-sectional view showing the structure of the semiconductor integrated circuit according to a tenth embodiment of the present invention.
Figure 27A:
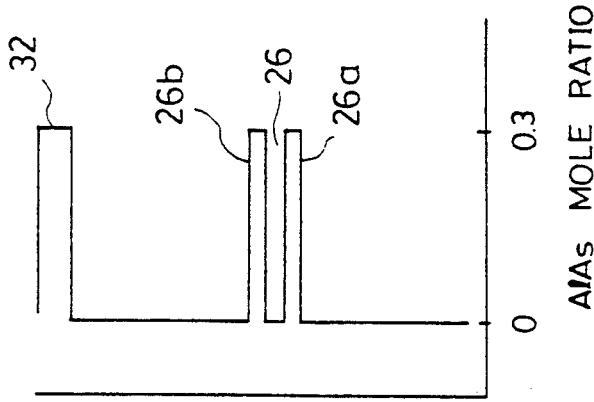
FIGS. 27A-27C are diagrams showing the temperature of growth of the semiconductor layers used at the time of formation of the structure of FIG. 26, the distribution of the defects in the structure of FIG. 26, and the distribution of the AlAs mole fraction in the structure of FIG. 26, respectively.
Figure 27B:
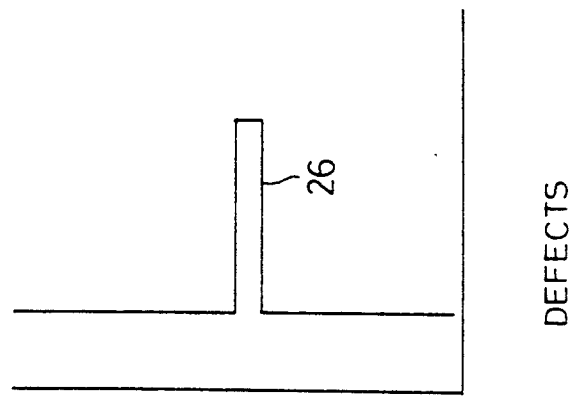
Figure 27C:
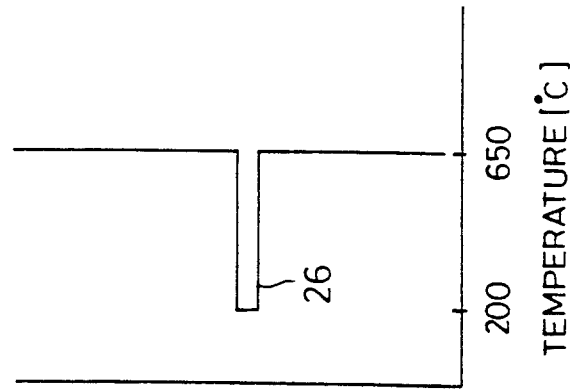

Next, a tenth embodiment of the present invention will be described with reference to FIG. 26 and FIGS. 27A–27C, wherein FIG. 27A shows the temperature used for growing the semiconductor layers in the structure of FIG. 26 while FIG. 27B shows the amount of defects introduced into the semiconductor layers and FIG. 27C shows the composition of the semiconductor layers represented in terms of the mole ratio of aluminum arsenide contained in the semiconductor layers.

This embodiment is intended to eliminate the small dip of the drain current $I_D$ that still remains in the result of FIG. 10B even when the foregoing structure is employed. In the present embodiment, the injection of the hot electrons into the insulating GaAs buffer layer 26 is eliminated further by the provision of barrier layers 26a and 26b that have a band gap substantially larger than the band gap of GaAs at the both sides of the GaAs buffer layer 26.

For this purpose, the present embodiment employs the undoped AlGaAs represented by the formula $Al_x Ga_{1-x}As$ with the compositional parameter x between 0.2–0.5, typically 0.3, for the layers 26a and 26b. The layers 26a and 26b are grown by the MBE process similarly to the other layers with a thickness of 500Å at the temperature of identical with the temperature of growth of the semiconductor layers other than the buffer layer 26. As shown in FIG. 27A, the temperature of growth of the semiconductor layers such as the GaAs buffer layer 24, AlGaAs layers 26a and 26b, the buffer layer 28, and the device layer 36 are grown at 650° C. in the present embodiment while the GaAs buffer layer 26 is grown at 200° C. Of course, the foregoing temperature of growth of the layers 24, 26a, 26b, 28 and 36 may be set to 680° C. similarly to the case of the previous embodiments. In response to the low temperature of growth of the buffer layer 26, the layer 26 incorporates therein a large amount of defects as shown in FIG. 27B.

As described previously, the present embodiment provides AlGaAs at both sides of the GaAs buffer layer 26 as the layers 26a and 26b for excluding the injection of the hot carriers into the buffer layer 26. Thereby, the compositional profile of FIG. 27C exhibits the existence of Al in the structure in correspondence to the buffer layers 26a and 26b. Thereby, the present invention can provide a further suppression of the side gate effect. The existence of Al in FIG. 27C indicated by a numeral 32 corresponds to the AlGaAs electron supplying layer 32 of FIG. 26.

Figure 28:
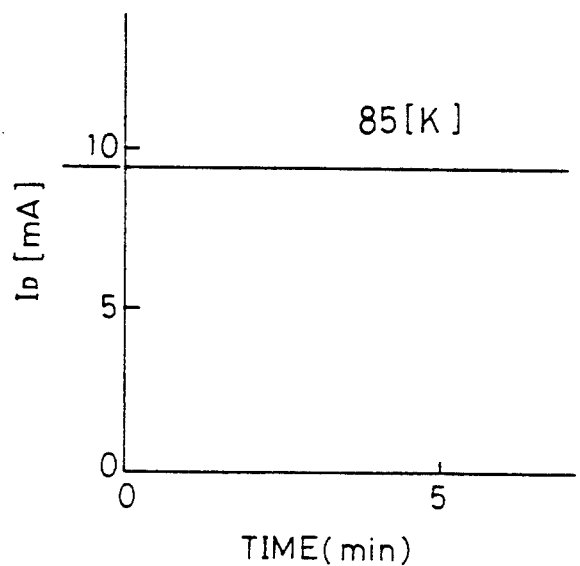
FIG. 28 is a diagram showing the effect of suppressing of the side gate effect achieved by the integrated circuit of FIG. 26.

FIG. 28 shows the result of an experiment conducted on the integrated circuit of FIG. 26 under a same condition as in the case of FIG. 10B. As can be seen in FIG. 28, the small dip of the drain current occurring in the case of FIG. 10B as a result of the side gate effect, is entirely eliminated in the structure of FIG. 26 and thus, the integrated circuit of the present embodiment is entirely free from the side gate effect.

Figure 29:
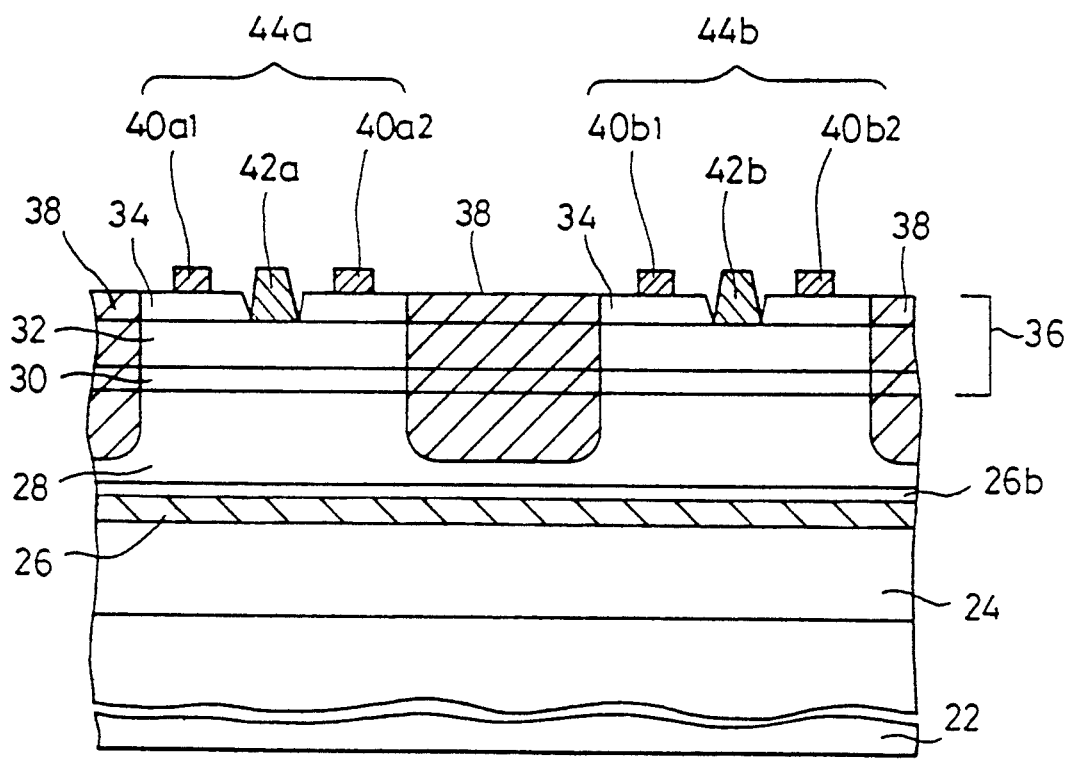
FIG. 29 is a cross-sectional view showing the structure of the semiconductor integrated circuit according to an eleventh embodiment of the invention.

FIG. 29 shows an eleventh embodiment of the present invention. In FIG. 29, the parts that are already described with reference to the preceding drawings are given identical reference numerals and the description thereof will be omitted.

In this embodiment, the AlGaAs layer 26a of the structure of FIG. 26 is omitted and thus, there is only one AlGaAs layer 26b adjacent to the insulating GaAs buffer layer 26 at the upper side thereof. In this construction, too, the hot electrons that are entering from the buffer layer 28 into the buffer layer 26 are effectively blocked by the layer 26b and the side gate effect is successfully eliminated.

Further, the present invention is not limited to these embodiments described heretofore but various variations and modifications may be made without departing from the scope of the invention.

What is claimed is:

1. A semiconductor integrated circuit including therein a plurality of active compound semiconductor devices, comprising:

a semiconductor substrate having a substrate upper major surface and a substrate lower major surface;

a first buffer layer of a first compound semiconductor material having a first upper major surface and a first lower major surface and provided on the substrate upper major surface of the semiconductor substrate, said first buffer layer grown at a first temperature producing a first concentration level of first defects and a first resistivity corresponding to the first concentration level of the first defects;

a second buffer layer of a second compound semiconductor material having a second upper major surface and a second lower major surface and provided on the first upper major surface of the first buffer layer, said second buffer layer grown at a second temperature less than the first temperature of the first buffer layer producing second defects with a second concentrate level that exceeds the first concentration level and having a second resistivity substantially larger than the first resistivity in correspondence to the second concentration level of the second defects;

a device layer having a device upper major surface and a device lower major surface and provided on the second upper major surface of the second buffer layer, said device layer being provided with the active compound semiconductor devices and forming a part of the active compound semiconductor devices; and a plurality of unconductive device isolation regions formed between the active devices, each of said plurality of unconductive device isolation regions being defined by a top boundary coincident to the device upper major surface of the device layer, a lateral boundary and a bottom boundary formed such that each of the plurality of unconductive device isolation regions extend from the device upper major surface of the device layer toward the substrate lower major surface of the substrate and such that the bottom boundary of each of the plurality of device isolation regions is located at least below the device lower major surface of the device layer.

2. A semiconductor integrated circuit as claimed in claim 1, in which each of said plurality of device isolation regions is formed such that the bottom boundary is located below the second lower major surface of the second buffer layer.

3. A semiconductor integrated circuit as claimed in claim 1, in which each of said plurality of device isolation regions comprises a region of increased concentration of impurities that forms a deep impurity level in the first and second compound semiconductor materials.

4. A semiconductor integrated circuit as claimed in claim 1, in which each of said plurality of device isolation regions comprises an isolation trench formed between the plurality of active compound semiconductor devices that are adjacent with each other, said isolation trench having a trench top boundary coincident to the device upper major surface of the device layer, a trench lateral boundary coincident to the lateral boundary of the plurality of device isolation regions and a trench bottom boundary coincident to the bottom boundary of the plurality of device isolation regions.

5. A semiconductor integrated circuit as claimed in claim 1, in which each of said plurality of device isolation regions comprises an isolation trench having a trench lateral boundary substantially coincident to the lateral boundary of the plurality of device isolation regions and a trench bottom boundary, said trench bottom boundary is located above the bottom boundary of the plurality of device isolation regions, and an unconductive region provided between the bottom boundary of the plurality of device isolation regions and the trench bottom boundary of the isolation trench.

6. A semiconductor integrated circuit as claimed in claim 5, in which said unconductive region comprises the first compound semiconductor material having defects with a concentration level such that the unconductive region behaves substantially as an insulating region.

7. A semiconductor integrated circuit including therein a plurality of active compound semiconductor devices, comprising:

a semiconductor substrate having a substrate upper major surface and a substrate lower major surface;

a first buffer layer of a first compound semiconductor material having a first upper major surface and a first lower major surface and provided on the substrate upper major surface of the semiconductor substrate, said first buffer layer having a first concentration level of first defects and a first resistivity corresponding to the first concentration level of the first defects;

a second buffer layer of a second compound semiconductor material having a second upper major surface and a second lower major surface and provided on the first upper major surface of the first buffer layer, said second buffer layer incorporating therein second defects with a second concentration level that exceeds the first concentration level and having a second resistivity substantially larger than the first resistivity in correspondence to the second concentration level of the second defects;

a third buffer layer of a third compound semiconductor material having a third upper major surface and a third lower major surface and provided between the substrate upper major surface of the substrate and the first lower major surface of the first buffer layer, said third buffer layer incorporating therein third defects with a third concentration level exceeding the first concentration level and a third resistivity corresponding to the third concentration level that exceeds the first resistivity;

a device layer having a device upper major surface and a device lower major surface and provided on the second upper major surface of the second buffer layer, said device layer being provided with the active compound semiconductor devices and forming a part of the active compound semiconductor devices; and a plurality of unconductive device isolation regions formed between the active devices, each of said plurality of unconductive device isolation regions being defined by a top boundary coincident to the device upper major surface of the device layer, a lateral boundary and a bottom boundary formed such that each of the plurality of unconductive device isolation regions extend from the device upper major surface of the device layer toward the substrate lower major surface of the substrate and such that the bottom boundary of each of the plurality of device isolation regions is located at least below the device lower major surface of the device layer.

8. A semiconductor integrated circuit as claimed in claim 1, in which said second compound semiconductor material formed the second buffer layer has a first band gap and said semiconductor integrated circuit further includes a third buffer layer of a third compound semiconductor material that has a second band gap substantially larger than the first band gap of the second buffer layer, said third buffer layer having a third upper major surface and a third lower major surface and provided at least one the second buffer layer such that the third lower major surface of the third buffer layer is located on the second upper major surface of the second buffer layer and that the third upper major surface of the third buffer layer is located under the device lower major surface of the device layer.

9. A semiconductor integrated circuit as claimed in claim 8, in which said first and second compound semiconductor materials comprise gallium arsenide and said third compound semiconductor material comprises aluminum gallium arsenide.

10. A semiconductor integrated circuit as claimed in claim 8, in which a fourth buffer layer identical in composition to said third buffer layer is further provided under the second buffer layer such that a fourth upper major surface of the fourth buffer layer is located under the second lower major surface of the second buffer layer and a fourth lower major surface of the fourth buffer layer is located on the first upper major surface of the first buffer layer.

11. A semiconductor integrated circuit including therein a plurality of active compound semiconductor devices, comprising:
   a semiconductor substrate having a substrate upper major surface and a substrate lower major surface;
   a first buffer layer of a first compound semiconductor material having a first upper major surface and a first lower major surface and provided on the substrate upper major surface of the semiconductor substrate, said first buffer layer having a first concentration level of first defects and a first resistivity corresponding to the first concentration level of the first defects;
   a second buffer layer of a second compound semiconductor material having a second upper major surface and a: second lower major surface and provided on the first upper major surface of the first buffer layer, said second buffer layer incorporating therein second defects with a second concentration level that exceeds the first concentration level and having a second resistivity substantially larger than the first resistivity in correspondence to the second concentration level of the second defects;
   said first and second compound semiconductor materials comprise gallium arsenide, wherein said first compound semiconductor material contains an equal amount of gallium and arsenic while said second compound semiconductor material contains the arsenic in a larger amount, in terms of a mole fraction, than the gallium;
   a device layer having a device upper major surface and a device lower major surface and provided on the second upper major surface of the second buffer layer, said device layer being provided with the active compound semiconductor devices and forming a part of the active compound semiconductor devices; and
   a plurality of unconductive device isolation regions formed between the active devices, each of said plurality of unconductive device isolation regions being defined by a top boundary coincident to the device upper major surface of the device layer, a lateral boundary and a bottom boundary formed such that each of the plurality of unconductive device isolation regions extend from the device upper major surface of the device layer toward the substrate lower major surface of the substrate and such that the bottom boundary of each of the plurality of device isolation regions is located at least below the device lower major surface of the device layer.

12. A semiconductor integrated circuit as claimed in claim 11, in which said mole fraction of the arsenic is larger than the mole fraction of the gallium by 1%.

13. A semiconductor integrated circuit including therein a plurality of active compound semiconductor devices, comprising:
   a semiconductor substrate having a substrate upper major surface and a substrate lower major surface;
   a first buffer layer of a first compound semiconductor material having a first upper major surface and a first lower major surface and provided on the substrate upper major surface of the semiconductor substrate, said first buffer layer having a first concentration level of first defects and a first resistivity corresponding to the first concentration level of the first defects;
   a second buffer layer of a second compound semiconductor material having a second upper major surface and a second lower major surface and provided on the first upper major surface of the first buffer layer, said second buffer layer incorporating therein second defects with a second concentration level that exceeds the first concentration level and having a second resistivity substantially larger than the first resistivity in correspondence to the second concentration level of the second defects;
   said first buffer layer and said second buffer layer have respective first and second thicknesses chosen such that the second thickness of the second buffer layer is one of equal to and smaller than about 1000Å and a sum of the first and second thicknesses of the first and second buffer layers is about 4000Å or more;
   a device layer having a device upper major surface and a device lower major surface and provided on the second upper major surface of the second buffer layer, said device layer being provided with the active compound semiconductor devices and forming a part of the active compound semiconductor devices; and
   a plurality of unconductive device isolation regions formed between the active devices, each of said plurality of unconductive device isolation regions being defined by a top boundary coincident to the device upper major surface of the device layer, a lateral boundary and a bottom boundary formed such that each of the plurality of unconductive device isolation regions extend from the device upper major surface of the device layer toward the substrate lower major surface of the substrate and such that the bottom boundary of each of the plurality of device isolation regions is located at least below the device lower major surface of the device layer.

14. A semiconductor integrated circuit as claimed in claim 1 in which there is provided a third buffer layer having an upper major surface and a lower major surface for separating the device layer from the second buffer layer such that the upper major surface of the third buffer layer is located under the lower major surface of the device layer and the lower major surface of the third buffer layer is located on the upper major surface of the second buffer layer.

* * * * *

UNITED STATES PATENT AND TRADEMARK OFFICE
CERTIFICATE OF CORRECTION

PATENT NO. : 5,276,340
DATED : January 4, 1994
INVENTOR(S) : YOKOYAMA et al.

It is certified that error appears in the above-indentified patent and that said Letters Patent is hereby corrected as shown below:

Column 1, line 6, "No. b 07/617,007" should be --No. 07/617,007--.

Column 8, line 49, "applied similarly" should be --applied across the source and drain electrodes 40b1 and 40b2 similarly--.

Column 9, line 12, "these" should be --the--.

Column 10, line 39, "these" should be --the--.

Column 12, line 37, "FIG. A" should be --FIG. 19A--.

Column 16, line 59, "formed" should be --forming--.

Signed and Sealed this

Twenty-fifth Day of October, 1994

Attest:

BRUCE LEHMAN

*Attesting Officer*  *Commissioner of Patents and Trademarks*